(12) United States Patent
Kameyama et al.

(10) Patent No.: US 6,281,570 B1
(45) Date of Patent: Aug. 28, 2001

(54) TAPE CARRIER FOR BGA AND SEMICONDUCTOR DEVICE USING THE SAME

(75) Inventors: Yasuharu Kameyama; Norio Okabe, both of Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 09/491,469

(22) Filed: Jan. 26, 2000

(30) Foreign Application Priority Data

Jan. 26, 1999 (JP) .................................................. 11-016548

(51) Int. Cl.[7] .................................................. H01L 23/48

(52) U.S. Cl. .......................................... 257/697; 257/666

(58) Field of Search .................................... 257/666, 697, 257/698, 690, 691, 692, 676

(56) References Cited

U.S. PATENT DOCUMENTS 6,114,751 * 9/2000 Kumakura et al. .................. 257/666

FOREIGN PATENT DOCUMENTS 2000-286294-A * 10/2000 (JP) .

* cited by examiner

*Primary Examiner*—Phat Xuan Cao
(74) *Attorney, Agent, or Firm*—Scully, Scott, Murphy & Presser

(57) ABSTRACT

A tape carrier is constituted comprising land 12 for solder ball, formed in a predetermined pattern on insulating film 7 having device hole 10 formed in the middle, leads 9 to be connected to a semiconductor chip, plating power-feeding lead 13 having one end connected to lead 9 and formed on insulating film 7, and easily-broken part 19 provided in the middle of the power-feeding leads. A semiconductor device is constituted wherein tape carrier 2 is provided with plating power-feeding lead 13 formed on insulating film 7, one end of which is drawn out of insulating film 7, the other end being connected to leads 9, and plating power-feeding lead 13 is disconnected from the leads when semiconductor chip 1 is installed. Thus, a tape carrier for BGA which is manufactured easily, capable of achieving higher density of wiring in the wiring pattern, improved in water-resistance and reliability, and a semiconductor device using the same are provided.

6 Claims, 5 Drawing Sheets

TAPE CARRIER FOR BGA AND SEMICONDUCTOR DEVICE USING THE SAME

FIELD OF THE INVENTION

This invention relates to a tape carrier for BGA (Ball Grid Array) and a semiconductor device using the same, and more particularly to a tape carrier for BGA improved in wiring density and humidity resistance and to a semiconductor device using the same.

BACKGROUND OF THE INVENTION

Recently, in response to requirements for compactness of packages and high density of mounting packages, a package (semiconductor device) of a small size called CSP (chip size package) having BGA structure using a tape carrier facilitating high-density wiring has been proposed. Particularly, several kinds of packages equal in size to semiconductor chips have been developed. Among them, a micro-BGA package devised by TESSERA Company is noticed as a highly reliable semiconductor package.

Construction of majority of these semiconductor devices is of a style in which there is mounted a semiconductor chip of center-pad type, in which electrodes are formed to be arranged along the central line of the chip, on a silicon resin layer provided on one surface of a tape carrier having an opening. Electrode portions of the semiconductor chip, leads connected to solder balls formed on the tape carrier, and the opening of the tape carrier are embedded to be protected by insulative sealing material.

FIG. 1 and FIG. 2 show the structure of wiring pattern in a conventional tape carrier having insulative film 7 having device hole 10 formed at the center and via-holes 11, and plating power-feeding leads 13 to form gold electro-plating layer 14 on the wiring pattern of conductor layer 8 including leads 9 and lands 12. Below tape carrier 2, there is provided elastmer 3 for mounting a semiconductor chip. The outer ends of plating power-feeding leads 13 are cut off and removed by outside punching tools 17 or the like after gold electro-plating layer 14 is formed.

For the manufacture of the tape carrier, insulating film 7 made of polyimide or the like is punched to form device hole 10 and via-holes 11, then, the wiring pattern of conductive layer 8 of leads 9, lands 12 and power-feeding leads 13 are formed on insulating film 7 by way of photo-etching. Gold electro-plating layer 14 is provided on the wiring pattern, power-feeding leads 13 exposed outside is cut off and removed by means of outside punching tool 17. Thereafter, elastic body (elastomer) 3 is provided on conductor layer 8 so as not to be projected outward from the periphery of insulating film 7.

FIG. 3 shows the structure of a conventional semiconductor device of BGA type. FIG. 4 shows a plan view of the semiconductor device (from the side of solder ball side). FIG. 5 shows the bottom of the semiconductor device (semiconductor chip side).

The semiconductor device is provided with semiconductor chip 1, tape carrier 2, elastomer 3 fixing both of semiconductor chip 1 and tape carrier 2, sealant 5 for protecting electrode portion 4 of semiconductor chip 1, and solder ball 6 serving as electrode for the semiconductor device, in its structure.

Owing to the structure of this semiconductor device, semiconductor chip 1 is mounted and fixed on the side of elastomer 3 of the tape carrier, whereby electrode 4 of semiconductor chip 1 and lead 9 of the tape carrier are joined electrically. Further, electrode 4 of semiconductor chip 1 and lead 9, thus joined, and device hole 10 are sealed air-tight by insulating sealant 5. Then, solder ball 6 is placed on land 12 of the tape carrier, and at last, by cutting along piece-cutting line 21 (FIG. 2), the semiconductor device is completed.

In the conventional tape carrier, however, wiring pattern is expanded and it is not easy to form a high density wiring, because the power-feeding leads 13 are drawn for each lead 9. Thus, it is difficult to respond to requirements for compactness and increase in number of pins. Moreover, when a semiconductor device using a conventional tape carrier is subjected to PCT (pressure cooker test) to evaluate the humidity resistance after completion of the package, water permeates from the terminal surface of power lead 13 exposed to the outside of the package (FIG. 3) and reaches lead 9 connected to electrode portion 4 of the semiconductor chip, thereby corrosion occurs at electrode portion 4 of the semiconductor chip.

SUMMARY OF THE INVENTION

Accordingly, the object of the invention is to provide a tape carrier for BGA to be manufactured easily and capable of accomplishing higher density of wiring pattern, and to provide a semiconductor device using the same.

The other object of the invention is to provide a tape carrier for BGA improved in humidity resistance of wiring pattern of the tape carrier and reliability of the package, and a semiconductor device using the same.

According to the invention, a tape carrier for BGA including a predetermined pattern of lands for solder balls, leads connected to a semiconductor chip, and wirings for connecting the leads and the leads formed on an insulation film, the tape carrier, comprises:

a plating power-feeding lead formed on the insulative film, one end of the plating power-feeding lead being extended outside the insulative film, the other end of the plating power-feeding lead being connected to the leads or the wirings, and a predetermined point of the plating power-feeding lead at which an easily cutting portion is formed.

According to the other feature of the invention, a semiconductor device including a semiconductor chip having a plurality electrodes, and a tape carrier for BGA including a predetermined pattern of lands for solder falls, leads connected to the plurality of electrodes, and wirings for connecting the lands and the leads formed on an insulative film, the tape carrier, comprising;

a plating power-feeding lead formed on the insulative film, one end of the plating power-feeding lead being extended outside the insulative film, the other end of the plating power-feeding lead being connected to the leads or the wirings, and a predetermined point of the plating power-feeding lead at which an easily cutting portion is formed.

BRIEF DESCRIPTION OF THE DRAWINGS

The invention will be explained in more detail in conjunction with appended drawings, wherein.

DESCRIPTION OF THE PREFERRED EMBODIMENTS

Figure 1:
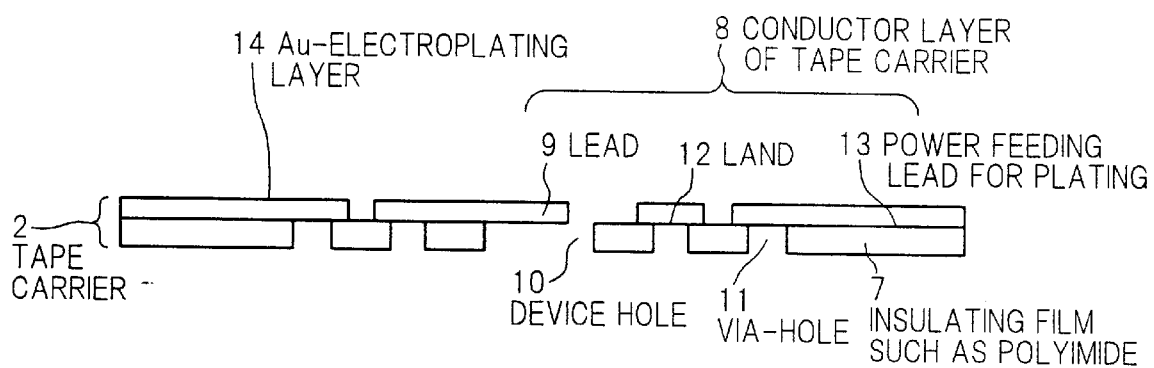
FIG. 1 is an explanatory cross-sectional view showing a conventional tape carrier.
Figure 2:
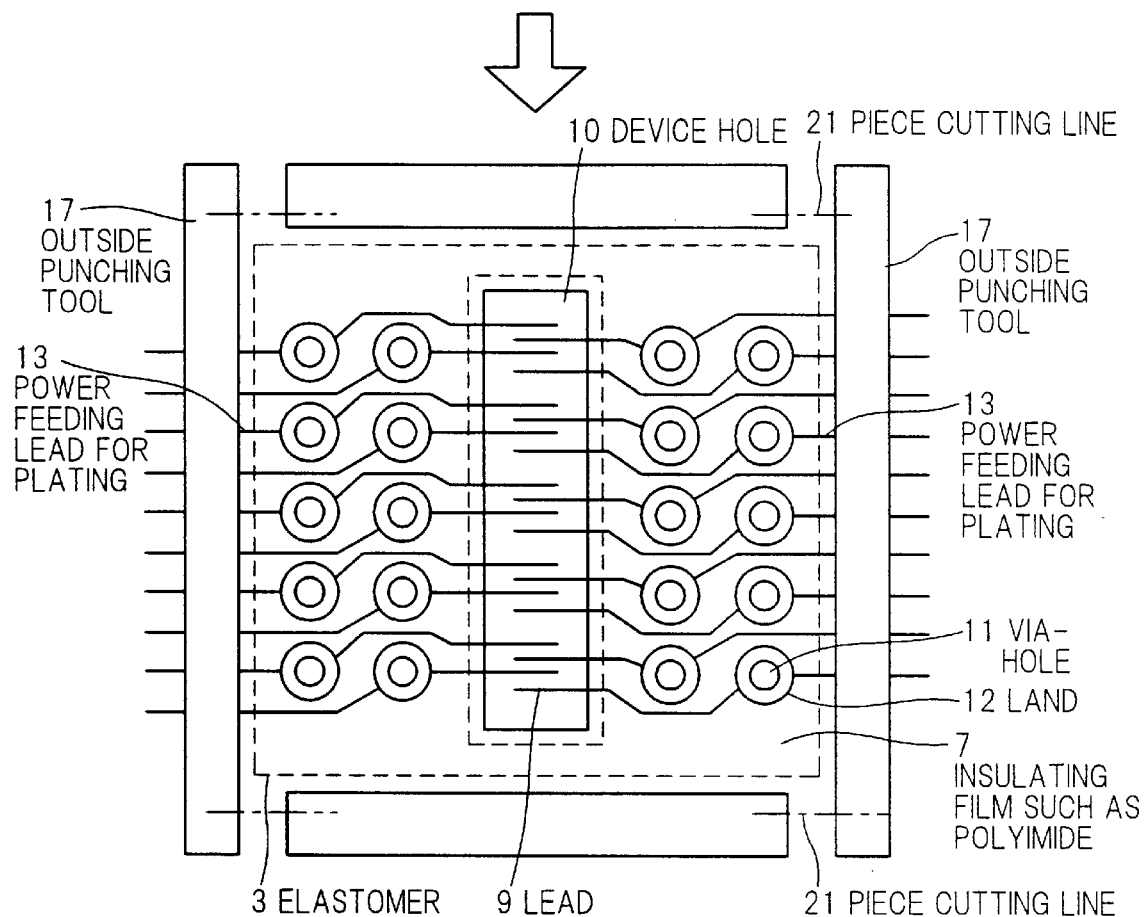
FIG. 2 is an explanatory plan view showing the wiring pattern of a conventional tape carrier.
Figure 3:
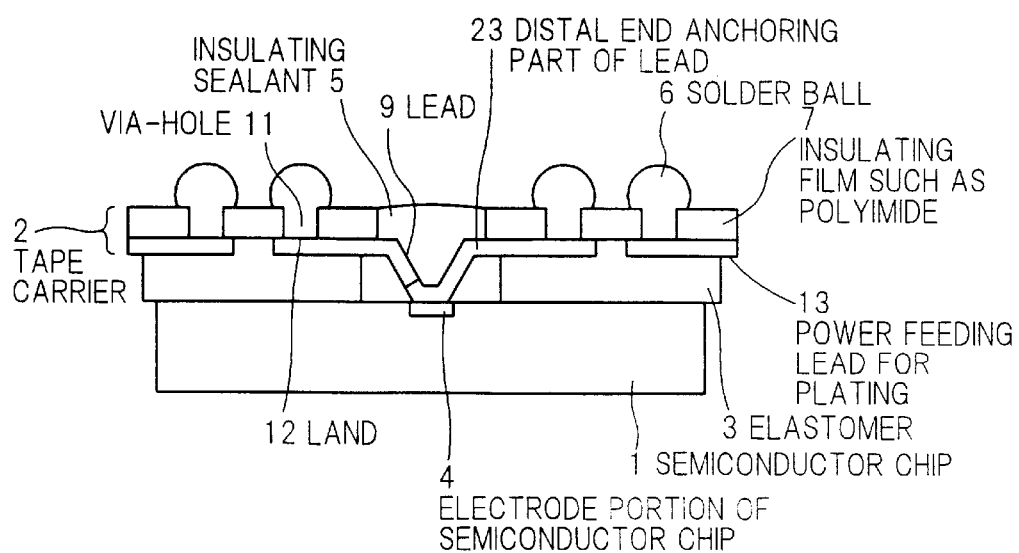
FIG. 3 is an explanatory view of a conventional semiconductor device.
Figure 4:
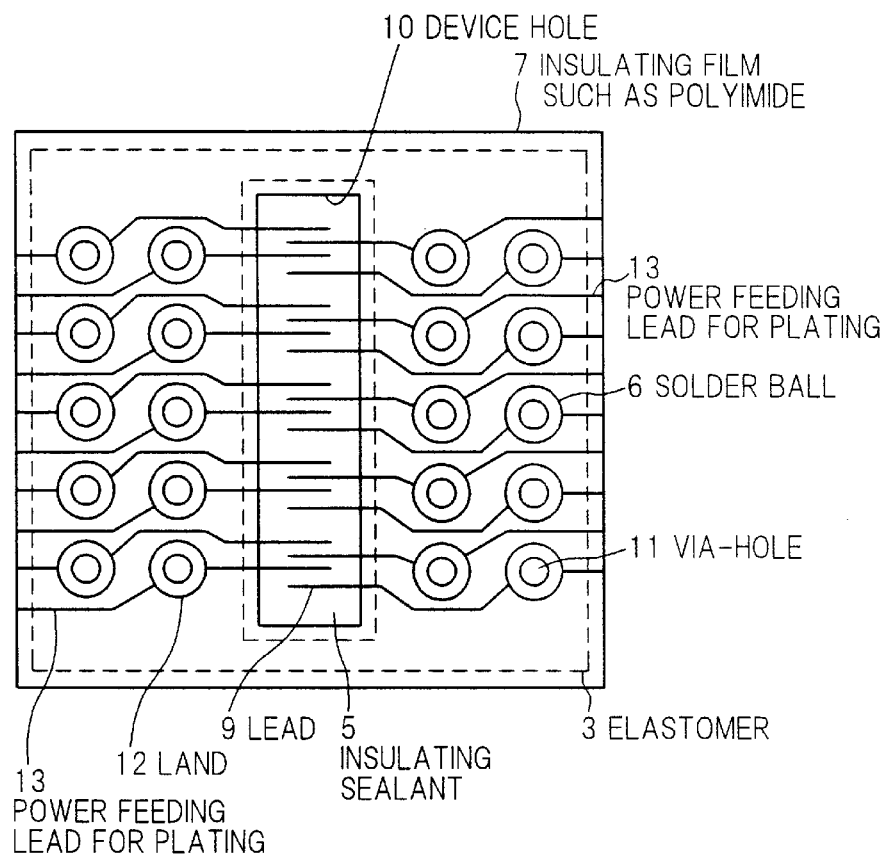
FIG. 4 is a plan view of the semiconductor device shown in FIG. 3 (solder ball side).
Figure 5:
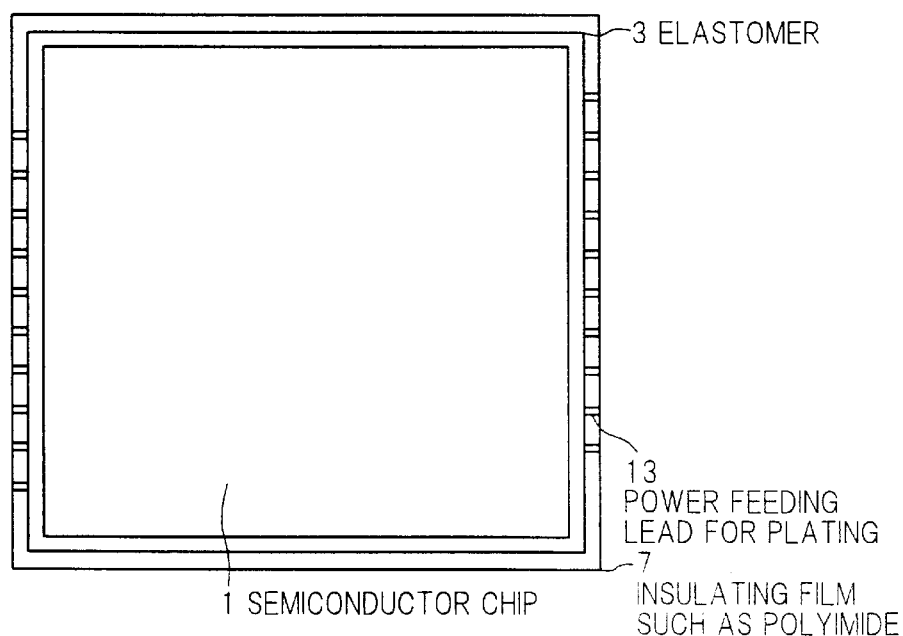
FIG. 5 is a bottom view of the semiconductor device shown in FIG. 3 (semiconductor chip side).
Figure 6:
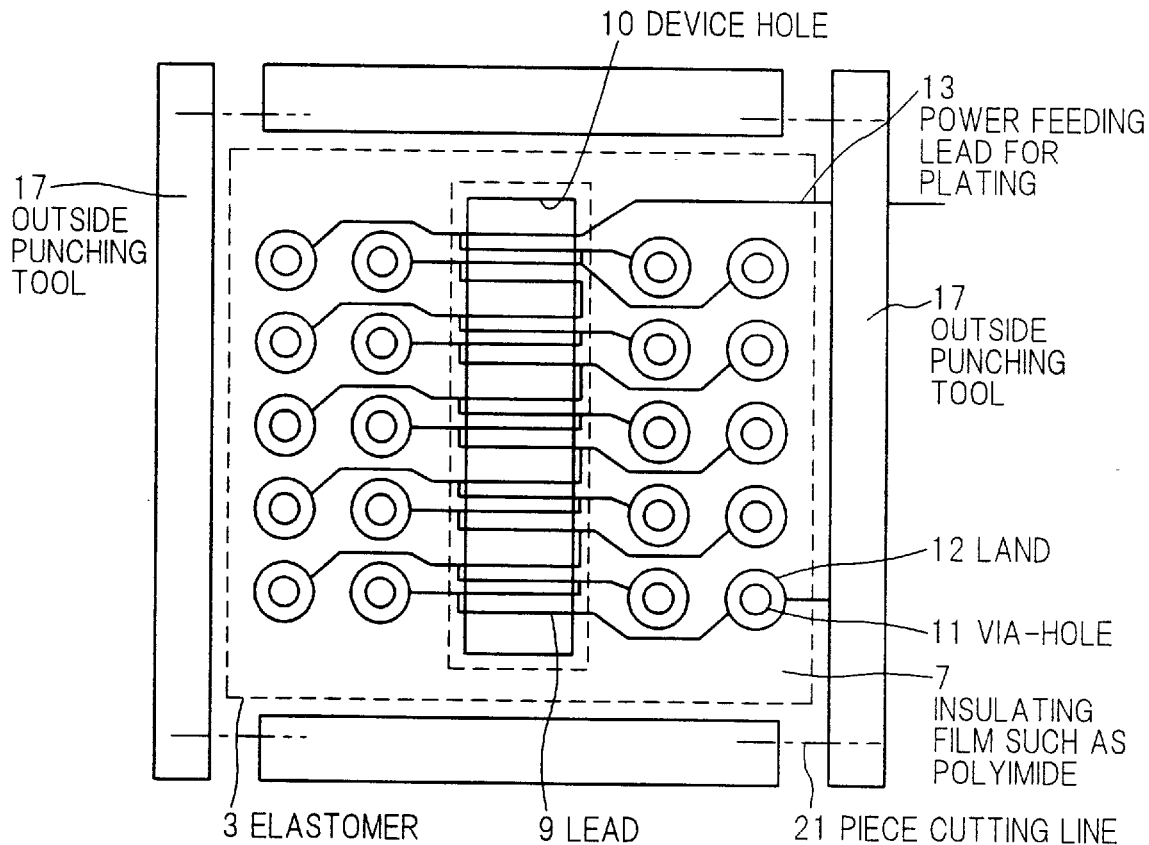
FIG. 6 is an explanatory plan view showing the wiring pattern of a tape carrier for BGA according to an embodiment of the present invention.

FIG. 6 shows the construction of a tape carrier for BGA according to an embodiment of the invention. The tape carrier is provided with insulating film 7 of polyimide or the like, having device hole 10 formed in the middle and via-hole 11, and lands 12 for solder balls, leads 9 to be connected electrically to electrode portion 4 of a semiconductor chip and plating power-feeding lead 13 connected to lead 9, respectively formed on insulating film 7 in a predetermined pattern. An easily cutting portion (shown in FIGS. 8 and 9) is provided in the middle of plating power-feeding lead 13.

Since one end of plating power-feeding lead 13 is extended out of insulating film 7 and the other end is connected to lead 9, the circuit formed by connecting lead 9 and plating power-feeding lead 13 is used as a power circuit when gold electro-plating layer 14 is formed. On the lower side of the tape carrier, elastomer 3 is provided for mounting a semiconductor chip.

As the outer margin of power-feeding leads 13 extended out of insulating film 7 is of no use after gold electro-plating layer 14 is formed, it is cut off by a tool and removed. In this connection, tape carrier manufactured continuously is, after furnished with elastomer 3 at last, is cut along piece-cutting line 21 of tape carrier 2 and completed to be a tape carrier for BGA.

Figure 7:
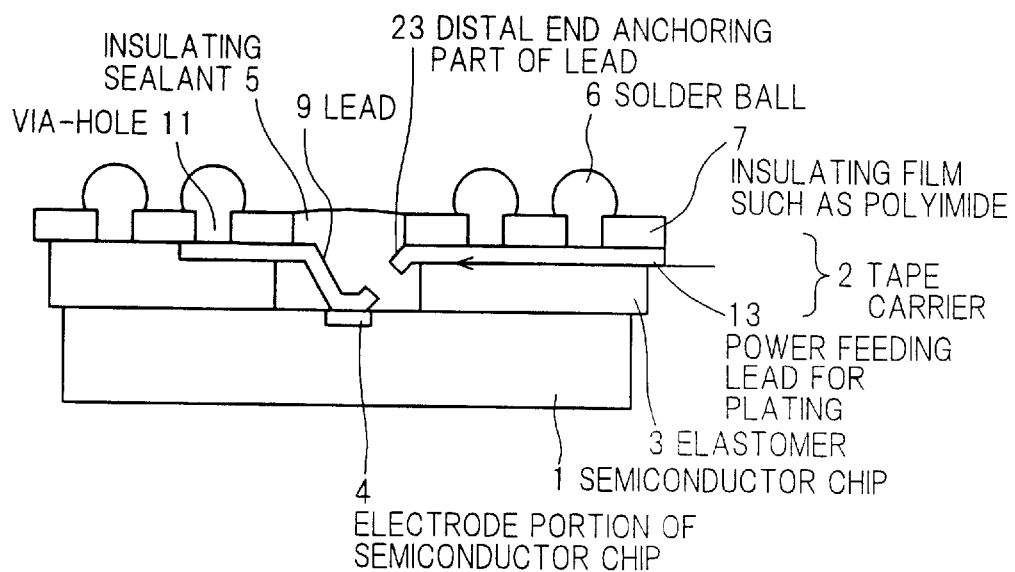
FIG. 7 is an explanatory view of the semiconductor device according to an embodiment of the present invention.

FIG. 7 shows the construction of semiconductor device of BGA type according to an embodiment of the invention. The semiconductor device is provided with semiconductor chip 1, leads 9 connected to a plurality of electrodes 4 of semiconductor chip 1, tape carrier 2 having on insulating film 7 a plurality of solder balls 6 for connecting leads 9 to an external circuit, and plating power-feeding lead 13 formed on insulating film 7, having one end extended out of insulating film 2 and the other end connected to a plurality of leads 9.

Semiconductor chip 1 is mounted on elastomer 3 fixed on tape carrier 2. Solder ball 6 serving as electrodes for semiconductor device is mounted on land 12 by way of via-hole 11 formed on insulating film 7. Lead 9 and electrodes 4 of semiconductor chip 1 are connected at the position of device hole 10 formed in the middle of insulating film 7 and protected by embedding with insulating sealant 5.

In the structure of the semiconductor device shown in FIG. 7 according to the embodiment, plating power-feeding lead 13 is disconnected from leads 9 to provide anchoring portion 23 on the distal end of the lead by a mechanical means when semiconductor chip 1 is mounted. The connection of plating power-feeding lead 13, leads 9 and anchoring portion 23 on the distal end of the lead is broken and separated apart in a portion of plating power-feeding lead 13 subsequent to assembly of the package. The connection between leads 9 and plating power-feeding lead 13 is broken and separated apart at the end of the lead at the time when the semiconductor device is assembled after gold electro-plating layer 14 has been formed, thus, even if water happens to permeate from plating power-feeding lead 13 as indicated by an arrow, the penetration of water is prevented at the position where leads 9 and anchoring portion 23 on the end of the lead is disconnected, so that the water penetration into electrode portion 4 of the semiconductor chip is prevented. Moreover, humidity resistance of the package is assured enough because plating power-feeding lead 13 is single, semiconductor chip 1 is mounted and fixed to the tape carrier on the side of elastomer 3 thereof, and the connected part of electrode portion 4 of semiconductor chip with leads 9 is sealed air-tight by means of insulating sealant 5, together with device hole 10. Further, high density of wiring pattern is achieved because plating power-feeding lead 13 is single.

Figure 8:
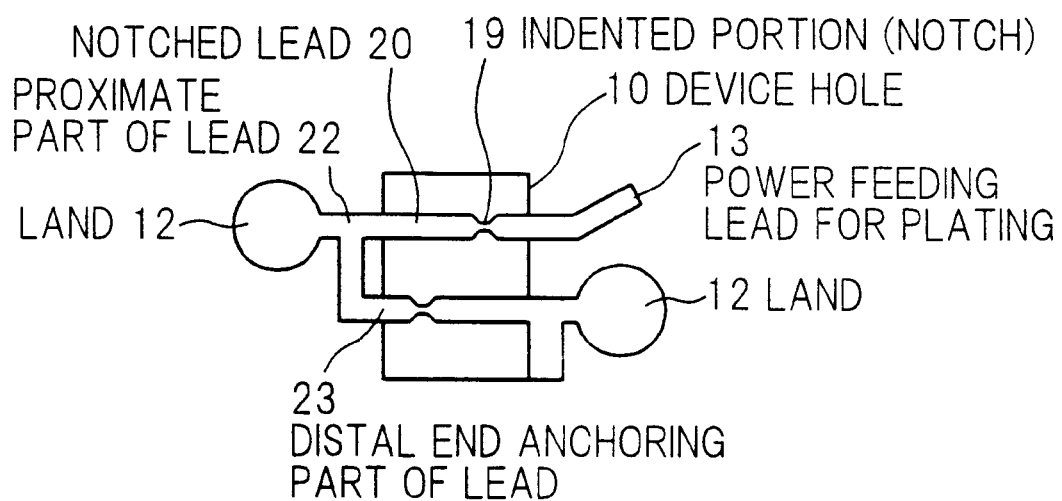
FIG. 8 is an explanatory view showing the form of notched lead used for the semiconductor device shown in FIG. 7.

FIG. 8 shows the shape of the notched lead used in the semiconductor device (FIG. 7). Plating power-feeding lead 13 projected into device hole 10 of the tape carrier, being held at one end, and connected with each other is located so as to bridge device hole 10. Plating power-feeding lead 13 is provided with a portion to be easily cut off which consists of indentation (notched) 19 so as to be cut off easily on assembly of the package, whereby notched lead 20 is formed. Lead proximate end portion 22 and anchoring portion 23 on the end of lead adjacent thereto are formed in connected state, thus, being constructed so as to be able to supply lead 3 with electricity. Power supply from plating power-feeding lead 13 can be supplied on electro-plating by only plating power-feeding lead 13 which is single, because the circuit is formed only by connection with anchoring portion 23 at one end of any of leads 9 located over device hole 10.

Each of leads 9 connected with each other is provided with a portion to be broken easily which consists of indentation (notched) 19 so as to be cut apart easily on assembly of the package, whereby notched lead 20 is formed. This notch 19 is broken and extended apart by a mechanical means subsequent to the assembly of semiconductor device before insulating sealant 5 is injected, thus, even if water could permeate from plating power-feeding lead 13 which is exposed, penetration of water is prevented at the broken position at notch 19.

Figure 9:
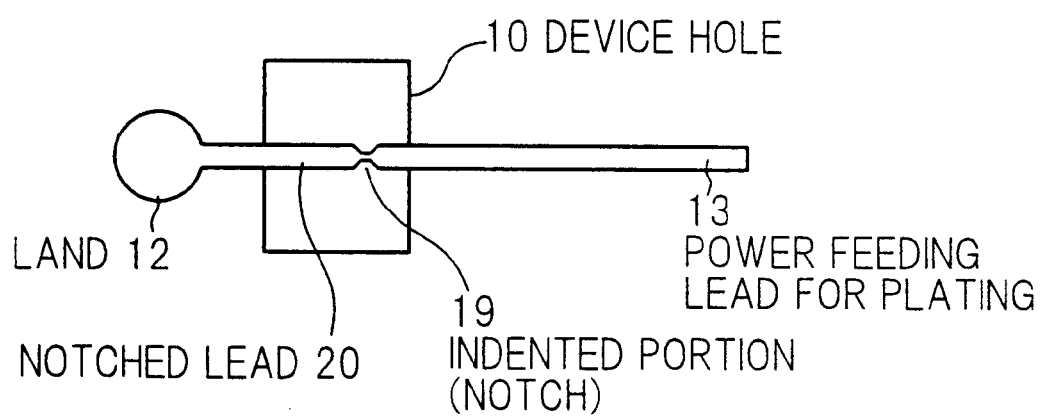
FIG. 9 is an explanatory view showing the form of notched lead according to another embodiment of the invention.

FIG. 9 shows the form of notched lead in another embodiment. A plurality of independent leads 9 connected with plating power-feeding lead 13 and projected into device hole 10 of the tape carrier, being held at one end, is formed so as to bridge device hole 10. Plating power-feeding lead 13 is provided with a portion to be broken easily which consists of indentation (notched) 19 so as to be cut apart easily on assembly of the package, whereby notched lead 20 is formed. This notch 19 is broken and separated apart by a mechanical means subsequent to the assembly of semiconductor device before insulating sealant 5 is injected, thus, even if water could permeate from plating power-feeding lead 13 which is exposed, the penetration of water is prevented at the position broken at notch 19.

In the tape carrier for BGA and the semiconductor device according to the invention, having a plating power-supply lead exposed to the outside of the package, a notched lead provided with a portion to be broken easily consisting of an indentation facilitating cutting is used between leads and the power-feeding leads for plating, so that the indentation is broken and extended apart subsequent to the assembly of semiconductor device. Therefore, even if water could permeate from power-feeding lead for plating which is exposed to outside of the package, penetration of water is prevented at the position of indented portion, so that water does not intrude into the electrode portions of semiconductor chip located in the middle part. Accordingly, such effects are obtained that corrosion of the electrode portion due to water penetration is prevented, water-resistance of the semiconductor device is improved significantly, as well as a tape carrier for BGA improving remarkably the reliability of semiconductor device and a semiconductor device using the same can be provided.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A tape carrier for BGA including a predetermined pattern of lands for solder balls, leads connected to a semiconductor chip, and wirings for connecting said leads and said leads formed on an insulation film, said tape carrier, comprising:

a plating power-feeding lead formed on said insulative film, one end of said plating power-feeding lead being extended outside said insulative film, the other end of said plating power-feeding lead being connected to said leads or said wirings, and a predetermined point of said plating power-feeding lead at which an easily cutting portion is formed.

2. A tape carrier for BGA as defined in claim 1, wherein said leads consist of a plurality of leads connected each other, and said plating power-feeding lead consists of a single plating power-feeding lead connected with said plurality of leads in common.

3. A tape carrier for BGA as defined in claim 1, wherein said leads consist of a plurality of independent leads, and said plating power-feeding lead consists of a plurality of plating power-feeding leads corresponding respectively to said plurality of leads.

4. A semiconductor device including a semiconductor chip having a plurality of electrodes, and a tape carrier for BGA including a predetermined pattern of lands for solder falls, leads connected to said plurality of electrodes, and wirings for connecting said lands and said leads formed on an insulative film, said tape carrier, comprising;

a plating power-feeding lead formed on said insulative film, one end of said plating power-feeding lead being extended outside said insulative film, the other end of said plating power-feeding lead being connected to said leads or said wirings, and a predetermined point of said plating power-feeding lead at which an easily cutting portion is formed.

5. A semiconductor device as defined in claim 4, wherein said leads consist of a plurality of leads connected each other, and said plating power-feeding lead consists of a single plating power-feeding lead connected with said plurality of leads in common.

6. A semiconductor device as defined in claim 4, wherein said leads consist of a plurality of independent leads, and said plating power-feeding lead consists of a plurality of plating power-feeding leads corresponding respectively to said plurality of leads.

* * * * *